United States Patent [19]

Dobkin

[11] Patent Number: 5,639,343

[45] Date of Patent: Jun. 17, 1997

[54] METHOD OF CHARACTERIZING GROUP III-V EPITAXIAL SEMICONDUCTOR WAFERS INCORPORATING AN ETCH STOP LAYER

[75] Inventor: Daniel Mark Dobkin, Sunnyvale, Calif.

[73] Assignee: Watkins-Johnson Company, Palo Alto, Calif.

[21] Appl. No.: 571,518

[22] Filed: Dec. 13, 1995

[51] Int. Cl.[6] ............................. C09K 13/00; H01L 21/00
[52] U.S. Cl. ..................... 156/627.1; 205/655; 205/645; 205/642; 156/656.1; 156/662.1; 156/628.1
[58] Field of Search ..................... 156/627.1, 655.1, 156/662.1; 205/642, 645, 655; 437/8

[56] References Cited

U.S. PATENT DOCUMENTS

| | | | |
|---|---|---|---|
| 4,028,207 | 6/1977 | Faktor et al. | 204/195 |
| 4,168,212 | 9/1979 | Faktor et al. | 254/1 |
| 4,215,185 | 7/1980 | Williams | 429/111 |
| 4,454,472 | 6/1984 | Moore | 324/158 |
| 4,482,442 | 11/1984 | Kohl et al. | 204/129.3 |
| 4,613,417 | 9/1986 | Laskowski et al. | 204/129.85 |
| 5,150,042 | 9/1992 | Look et al. | 324/158 |
| 5,226,449 | 7/1993 | Morris et al. | 437/51 |
| 5,300,200 | 4/1994 | Horanyi | 204/129 |
| 5,374,328 | 12/1994 | Remba et al. | 156/628 |
| 5,468,343 | 11/1995 | Kitano | 156/656.1 |

OTHER PUBLICATIONS

Thomas Ambridge, J.L. Stevenson, et al. "Applications of Electrochemical Methods for Semiconductor Characterization," J. Electrochem. Soc., vol. 127, No. 1, Jan. 1980, pp. 222–228.

*Primary Examiner*—R. Bruce Breneman
*Assistant Examiner*—Michael E. Adjodha
*Attorney, Agent, or Firm*—Flehr Hohbach Test Albritton & Herbert LLP

[57] ABSTRACT

The present invention comprises a method of characterizing a group III-V epitaxial semiconductor wafer in a characterization profiling apparatus having an electrolytic cell. The wafer contains at least a Group III-V compound first-layer and a thin etch stop layer atop of the first layer and at least one second layer atop of the etch stop layer having a differing composition from the etch stop layer. The wafer is placed in the electrolytic cell and the surface of the at-least second layer is etched with a citrate buffer solution of citric acid and a salt of citric acid under anodic bias conditions. The etchant is highly selective and etching terminates upon reaching the etch stop layer. A Schottky diode is formed between the wafer and the solution, and the wafer is characterized in situ by performing capacitance-voltage measurements which are evaluated to determine the threshold voltage of the semiconductor wafer.

16 Claims, 5 Drawing Sheets

FIG_1

FIG_2

FIG_3

FIG_4

FIG_5

FIG_6

FIG_7

FIG_8

FIG_9

METHOD OF CHARACTERIZING GROUP III-V EPITAXIAL SEMICONDUCTOR WAFERS INCORPORATING AN ETCH STOP LAYER

This invention relates generally to fabrication of Group III-V epitaxial semiconductor devices, and more particularly to a method for characterizing Group III-V epitaxial wafers by employing an etch stop layer in the wafer.

BACKGROUND OF THE INVENTION

The semiconductor industry requires economical fabrication of semiconductor circuits. Certain semiconductors, such as field effect transistors (FETs), and in particular Group III-V compound semiconductor FETs, are complex structures that are costly to fabricate. Of particular concern in the fabrication of such devices is the quality and uniformity of the devices which must perform to certain standards and characteristics. For example, high quality gallium arsenide metal semiconductor field effect transistors (GaAs MESFETs) are difficult to fabricate on epitaxially-grown layers for large scale integration. Control of device characteristics, such as the threshold voltage ($V_{th}$), is difficult to achieve.

Various methods have been employed to reduce variability in the transistor fabrication process. For example, one prior art method selectively etches Group III-V compound semiconductor wafers terminating the etch at an etch stop layer located at a desired depth. Such methods essentially eliminate variability in the transistor manufacturing process. However, such methods require that the incoming epitaxial material be precisely grown to required specifications since there is no means to vary the etching depth to compensate for material deviation from the required specifications. Thus, it is desirable to monitor certain electrical characteristics of the as-grown wafers to avoid processing material that is out of specification. A useful characteristic in evaluating incoming material is to determine the threshold voltage for the active layer grown on the wafer.

Various prior art methods have been used to monitor the characteristics of epitaxially-grown semiconductor layers. Such prior art methods are cumbersome and require the use of special test samples. The test samples may not be representative of the actual epitaxial structures since they are prepared without heavily doped cap layers, an important component of the FET. For example, a commonly used prior art method, the Hall measurement, only measures the sheet resistance of the top layer as a whole. It is not informative, especially if the sheet resistance is dominated by a doped layer that will be removed during fabrication of the transistor. Thus, this method requires a test sample with an undoped cap layer. Furthermore, the test is destructive; since it requires breaking the wafer being tested. A nondestructive method for testing the actual wafers and materials to be used in the fabrication of high-frequency transistors and other circuits prior to performing significant fabrication steps, is needed.

OBJECTS AND SUMMARY OF THE INVENTION

It is an object of this invention to provide a method of characterizing Group III-V epitaxial semiconductor devices, and more particularly to characterize Group III-V epitaxial layers prior to fabrication of devices thereon.

It is an object of this invention to provide a method for characterizing Group III-V semiconductor devices by employing an etch stop layer.

Another object of this invention is to provide an improved method which permits immediate in-situ characterization of the underlying structure of a device by performing capacitance-voltage measurements exactly at the etch stop layer.

A related object of this invention is to provide a method of characterization that does not require the use of test structures.

Yet another object of the present invention is to provide a method which characterizes wafers by predicting the threshold voltage of devices that will later be fabricated on the wafer.

These and other objects are achieved by the invention disclosed herein, generally comprising a method of characterizing a Group III-V epitaxial semiconductor wafer in a characterization profiling apparatus having an electrolytic cell. The wafer is placed in the cell and contains at least a Group III-V compound first-layer and a thin etch stop layer atop of said first layer and at least one second layer atop of said etch stop layer having a differing composition from said etch stop layer. The surface of the at-least second layer is etched with a citrate buffer solution of citric acid and a salt of citric acid under anodic bias conditions. The etchant is highly selective and etching terminates upon reaching the etch stop layer. A Schottky diode is formed between the wafer and the solution, and the wafer is characterized by performing capacitance-voltage measurements which are evaluated to determine the threshold voltage of the semiconductor wafer.

Further, the invention employs a solution of citric acid and a salt of citric acid such as potassium citrate, which is used to selectively etch Group III-V compounds, and particularly GaAs containing compounds in the presence of other GaAs compounds of higher Al mole fraction. Moreover, the solution may be employed as an electrochemical diode with appropriate electrodes and hardware, allowing selective removal of the first layer, termination of the etch at the etch stop layer and immediate in situ characterization of the underlying structure by performing capacitance-voltage measurements.

BRIEF DESCRIPTION OF THE DRAWINGS

Other objects and advantages of the invention become apparent upon reading of the detailed description of the invention and the appended claims provided below, with reference to the drawings in which:

DETAILED DESCRIPTION OF THE INVENTION

As will be appreciated by the detailed description below, the present invention provides a method of characterization of Group III-V compound semiconductor wafers prior to fabrication process such that a wafer can be tested for compliance with specifications prior to performing expensive fabrication techniques. The inventive method employs an etch stop layer, composed of AlGaAS or AlAs, within the wafer to be characterized. The wafer is etched in a conventional electrochemical etch/characterization apparatus. An electrolyte is used which is comprised of a citrate buffer including citric acid and a salt of citric acid. The electrochemical tool is operated under anodic bias conditions such that the electrolyte anodically etches layers of GaAs, either doped or undoped, and etching stops robustly upon reaching the etch stop layer. The cessation of etching upon reaching the etch stop layer is clearly shown by a sudden decrease in anodization current. Capacitance-voltage (C-V) measurements are performed using the electrolyte as a Schottky diode and then the threshold voltage is determined. Further analysis of the C-V curve may be performed to determine other characteristics such as carrier concentration and doping profiles. As may be appreciated, the inventive method does not require the use of elaborate test structures, and is successful for use with wafers containing highly doped cap layers.

Figure 1:
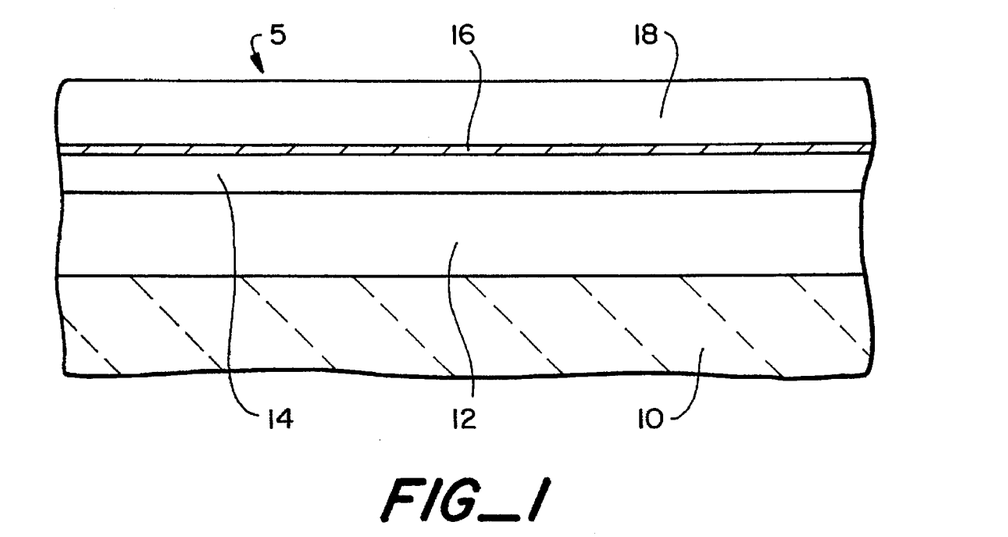
FIG. 1 generally shows a cross-sectional view of one embodiment of a semiconductor wafer which may be characterized by the method of the present invention prior to further processing which will eventually yield a GaAs based field effect transistor (FET).
Figure 2:
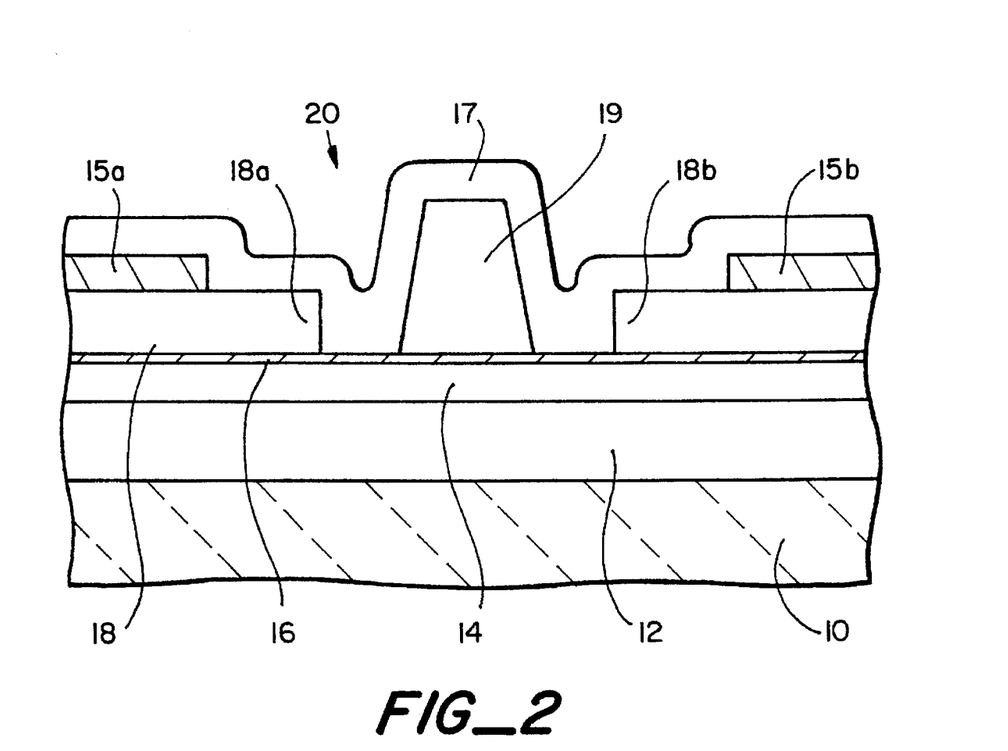
FIG. 2 shows a cross-sectional view of one embodiment of a final FET device which can be fabricated on said wafer, and whose electrical characteristics may be predicted using the method of the present invention.

Turning now to the drawings, wherein like components are designated by like reference numerals in the figures, FIGS. 1 and 2 illustrate wafers containing FET structures in two stages of processing which may be characterized according to the method of the present invention. FIG. 1 shows a cross sectional view of a semiconductor wafer 5 which may be characterized by the present method prior to fabrication which will yield a GaAs based FET. Generally, the initial structure may comprise a GaAs substrate 10, (or possibly a Si substrate), with a buffer layer 12 formed on the surface of substrate 10. An active layer 14 which conducts electrons for a majority carrier transistor, such as a FET, is formed on the buffer layer 12. An etch stop layer 16 of specific composition and thickness is formed on the active layer 14. The layer serves to stop the etching process. Atop the etch stop layer 16 are formed other layers which may be comprised of various thickness and levels of doping; including a highly doped layer 18 which makes conventional measurements very difficult to perform on any layer underneath this heavily doped layer. In an exemplary embodiment illustrated in FIG. 1, the wafer 5 generally includes a GaAs substrate 10 upon which is formed an undoped GaAs buffer layer 12 and a doped GaAs channel layer 14. Layers 12 and 14 may be formed by known techniques, preferably by molecular beam epitaxy (MBE) or metal-organic chemical vapor deposition (MOCVD). An etch stop layer 16 is formed, preferably by MBE or MOCVD, atop channel layer 14. The etch stop layer 16 may be comprised of $Al_xGa_{1-x}As$, and the Al content "x" (i.e. Al mole fraction) may range from substantially 0.30 to 1.0. Alternatively, the etch stop layer may be comprised of AlAs. The etch stop layer may be as thin as 6 angstroms, and generally ranges from 9 to 30 angstroms, with 9 to 12 angstroms being preferred when the Al content is x=1.0. Preferably, the etch stop layer is AlAs. The etching action can be successfully caused to stop on an etch stop layer of AlAs of 6 angstroms thickness, but as will be discussed later, the passivating oxide formed is extremely sensitive to cathodic bias and easily rendered penetrable. The preferred etch stop layer of 9 to 12 angstroms, or by example 25 to 30 angstrom $Al_{0.35}Ga_{0.65}As$ layers, result in passivating oxides which are robust and tolerate brief cathodic excursions or storage for several minutes in an unbiased condition without further anodic current flow.

Formed atop the etch stop layer 16 is a GaAs cap layer 18, which may be doped or undoped. While a specific example has been provided, it should be understood that layers of various material and composition may be used. For example, active layer 14 may be comprised of a number of materials as will be seen in the examples set forth below. Wafers were characterized in accordance with the present invention wherein the etch stop layer 16 thickness and the Al mole fraction were varied, as well as the thickness of the cap layer 18. It should be apparent to one skilled in the art that other combinations and structures may be employed, depending upon the type of device to be fabricated.

According to the method of the present invention, wafer 5 is characterized, and if the wafer meets required specifications, the wafer 5 is further processed to yield a FET 20 as shown in FIG. 2. FET 20 may be fabricated according to known techniques, and preferably is formed according to U.S. Pat. No. 5,374,328 owned by assignee and which is incorporated by reference herein. The FET 20 comprises source and drain electrodes 18a and 18b formed by layer 18 and a gate contact 19. Metal contacts 15a, 15b are provided on the source and drain electrodes. A passivation layer 17 protects the surface.

Figure 3:
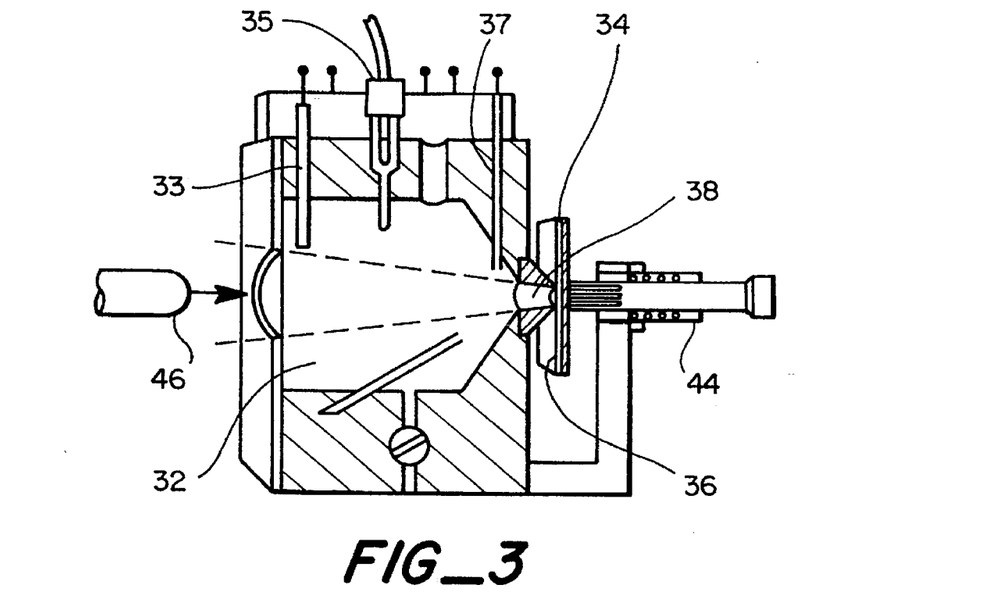
FIG. 3 illustrates a conventional electrochemical profiling apparatus with which the present invention may be practiced.

To characterize the wafer 5, a conventional electrochemical profiling apparatus is used as illustrated in FIG. 3. Further detailed description of the apparatus may be found in U.S. Pat. No. 4,168,212, which is incorporated by reference herein. The electrolyte is contained in cavity 32. Passage 32 has an orifice 38 which is in contact with wafer 34. Wafer 34 is positioned such that the surface 36 of wafer 34 is in direct contact with the electrolyte. A plunger attachment 44 secures the wafer 34 in place. Opposite the surface 36 of the wafer 34 is an illumination source 46. Typically four electrodes are employed within the electrochemical cell. Generally a platinum electrode is provided as a measurement electrode 37 for taking C-V measurements. Electrode 35 is provided as a reference, and preferably is a saturated calomel electrode (SCE) known in the art. Typically, a platinum cathode electrode 33 is provided, and the wafer/electrolyte system acts as a working electrode. The wafer to be tested is cleaned shortly prior to mounting on the electrochemical cell, preferably by conventional aqueous means such as brief immersion in a dilute solution of deionized water and ammonium hydroxide. The wafer is then mounted in the electrochemical cell, taking special care to avoid trapping air bubbles at the wafer surface during mounting.

The electrolyte contained in cavity 32 contacts the surface 36 of wafer 34, wherein the surface 36 will be etched. Of particular advantage is the electrolyte employed by the method of the present invention. The method employs a highly selective etchant which will robustly stop on the etch stop layer, forming a passivating oxide, whereby in-situ C-V measurements may then be performed. The stability of the etch stop layer allows the wafer to remain in the cell where measurements are made to characterize the device. The electrolyte is a buffered aqueous solution comprising citric acid [$HOC(CH_2COOH)_2COOH.H_2O$] and a salt of citric acid such as potassium citrate [$HOC(CH_2COOK)_2COOK.H_2O$]. The use of a citrate buffer as a highly selective etchant is taught in U.S. Pat. No. 5,374,328. The present invention utilizes the citrate buffer as a step in the inventive method for characterizing a device, however with a novel distinction; the present invention does not employ hydrogen peroxide ($H_2O_2$) in the buffer as taught in the '328 patent. In the present invention, the citrate buffer employs citric acid and a salt of citric acid, only, and the concentration of the buffer ranges from 0.6M to 1.0M, with a pH in the range of 3 to 6. Preferably the concentration is 1 M, which can be achieved by mixing equal parts of 1M citric acid and 1M potassium citrate. Etching of n-type material occurs upon illumination of the surface 36 of wafer 34 in the electrochemical cell and upon the application of anodic bias. To etch the surface under anodic bias, an anodic potential is applied between the platinum electrode 33 and the semiconductor working electrode. Generally, during etching of semiconductors, the surface of the device is oxidized and the resulting oxide is then dissolved into solution. In the present invention, illumination of the surface 36 causes photogenerated electron and hole pairs. The electrons are driven away from the surface due to the presence of the electric field, while the holes are attracted to the surface. A large number of holes coming to the surface perform the same oxidizing function as an oxidizer in solution. The use of illumination allows the control of the selective etching process. Thus, to summarize, the inventive method produces etching within an electrochemical cell by aid of illumination in an etchant which is highly selective to GaAs layers with respect to AlGaAs or AlAs layers. This enables a convenient method to selectively remove layers, including a heavily doped layer from atop the etch stop layer, and then to stop selectively upon reaching the etch stop layer, thereby terminating the etching process in a controlled manner, and finally performing an in-situ C-V measurement representative of the electrical characteristic of the wafer at the etch stop layer 16, which resides directly atop the channel layer 14 which will be the active channel region of the FET when fabrication is complete.

It is important to note that the selectivity will be lost if the surface 36 of the wafer 34 becomes cathodic. It appears that the mechanism which creates the selective etch is that sufficient Al concentration in the etch stop layer causes termination of the etching by formation of an electrically insulating layer of Al rich oxide. The citrate buffer ceases to etch the surface because the Al rich oxide formed at the etch stop layer is not dissolved by the solution. A cathodic condition at the surface 36 of the wafer 34 attracts electrons to the surface 36, and the electrons tend to reduce to the Al rich oxide, thereby removing or penetrating the passivating oxide which prevents selective cessation of the etch process. The inventor has observed that with the re-establishment of anodization bias it is possible to reconstruct the passivation oxide.

This behavior is in contradistinction to common etchants such as Tiron typically employed for electrochemical profiling of III-V semiconductor materials, which show very little selectivity for GaAs over AlGaAs. In particular, the ability to stop reliably upon the same very thin layer which will be used to stop the purely chemical recess etch taught in U.S. Pat. No. 5,374,328 enables the method to very accurately predict the characteristics of FET devices fabricated upon the material being characterized, without corrections or extrapolations. The formation of a stable passivating oxide allows repeated measurements of threshold voltage with nearly identical results, preferred for ensuring the reliability of a characterization technique.

The high selectivity of the etchant is of additional advantage due to the non-uniform nature of the etching process. To prevent adverse effects on the resulting FET device, the etch stop layer is very thin (in the range of 6 to 9 angstroms). If the etchant were only moderately selective the etching would penetrate through some areas of the thin etch stop layer, the underlying layers would be etched and the method would fail. Conventional etchants, such as Tiron commonly used in the electrochemical cell, are not selective and thus cannot be employed.

Figure 4:
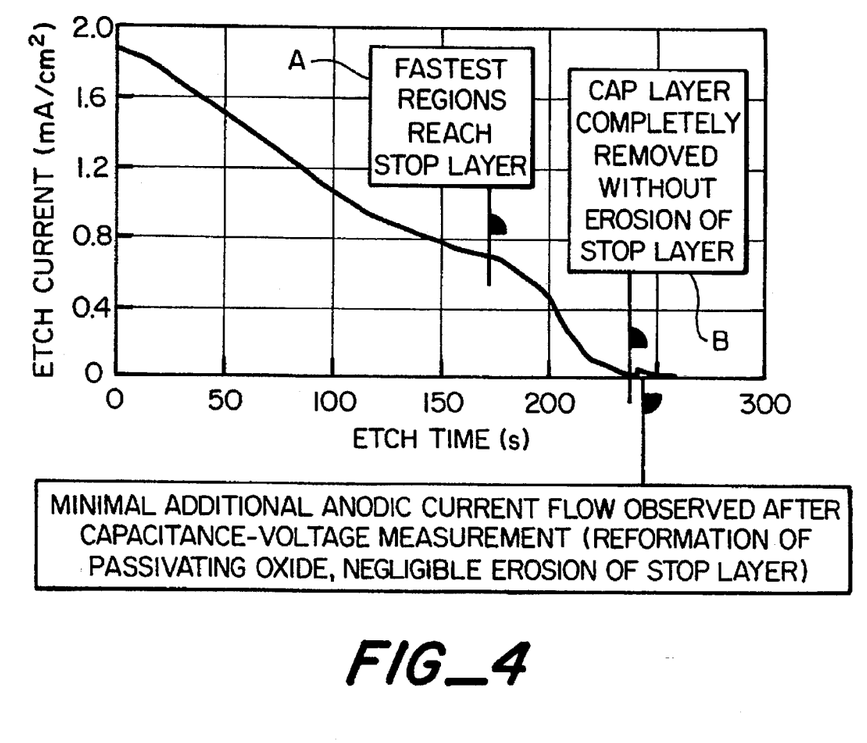
FIG. 4 is a graphical representation of etch current as a function of time elapsed under anodic dissolution according one embodiment of the method of the present invention.

Wafers were tested wherein the etch stop layer 16 composition was varied, as well as the thickness of the layer 16. Referring to FIG. 4 the resultant etch current as a function of time is depicted for a device shown in Table 1 which was characterized according to the method of the present invention. Table 1 illustrates a wafer containing a pseudomorphic high-electron mobility transistor (PHEMT) structure using an etch stop layer of 9 Å of AlAs. The buffer layer corresponds to layer 12 in FIG. 1, and the active layer 14 in the figure corresponds to the following layers set forth in Table 1: AlGaAs, doping plane, AlGaAs spacer, InGaAs well, and GaAs barrier. The AlAs etch stop layer corresponds to layer 16 in FIG. 1, and the GaAs cap layer corresponds to layer 18.

TABLE 1

| layer | mole % Al | thickness (Å) | dopant |
|---|---|---|---|
| GaAs cap | 0 | 1000 | $2.5 \times 10^{18}$ |
| AlAs etch stop | 100 | 9 | none |
| AlGaAs | 24 | 220 | none |
| doping plane | 0 | — | Si to spec |
| AlGaAs spacer | 24 | 20 | none |
| InGaAs well | 20% In | 120 | none |
| GaAs barrier | 0 | 400 | none |
| buffer | | 7000 | none |

Figure 5:
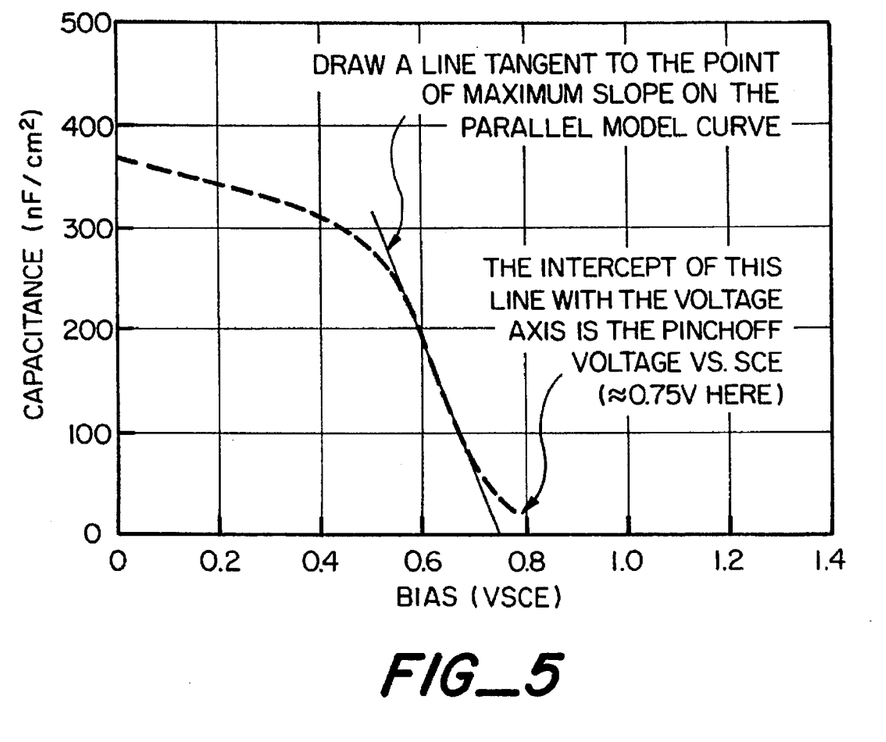
FIG. 5 depicts a resultant capacitance-voltage curve and value of the threshold voltage obtained according to one embodiment of the method of present invention.

PHEMT wafer:

The PHEMT wafer was anodized in a mixture of 1M citric acid/1M potassium citrate; and the voltage employed during the anodic etch was=0.1 VSCE (voltage referred to the saturated calomel electrode 35). Referring again to FIG. 4, the anodization time curve shows a strong and reproducible inflection, represented by point A, which is believed to occur as a result of the initial encounter of the etching process with the stop layer, at the location of fastest etching. The anodization current thereafter rapidly decreases as shown in FIG. 4, until virtually all of the cap layer of the PHEMT is removed and a small residual current flows. It can also be understood by reference to FIG. 4 that a capacitance-voltage measurement (the result of which is depicted in FIG. 5) may then be performed with illumination removed without further significant current flow (i.e. without erosion of the etch stop layer), as long as cathodic bias is avoided during the capacitance-voltage measurement.

An evaluation of the etch current verses time signals when the etching process ceases. As noted above, of particular advantage of the present invention is the high selectivity of the etchant. The etch stop layer is very thin and the etching is typically not uniform. It is easy to penetrate the etch stop layer under these circumstances, and thus it is critical that the etchant stop robustly. Referring again to FIG. 4, the cessation of etching is illustrated by a relatively sharp drop off in the etch current, represented by point B. Typically, the slope is not perfectly sharp, which suggests that there is some finite amount of time over which the cessation occurs. It is likely that the etch rate is not perfectly uniform, and thus in some regions the etch stop layer has not been reached and anodization continues to occur. This behavior dictates that the etchant must be highly selective. If the etchant were only moderately selective, the places that etch first would then penetrate the etch stop layer and etch the underlying layers. Consequently, conventional etchants, such as Tiron, do not work.

In order to characterize the device, the present invention provides for electrochemically removing the cap layer 18 on top of the etch stop layer 16, ceasing etching on the etch stop layer 16, and then performing an electrical measurement in which a Schottky barrier is formed by the interface between the solid semiconductor and the electrolyte. The electrical measurement represents the threshold voltage (also called the pinchoff voltage) of the underlying layer if a Schottky barrier is placed exactly on the stop layer, which is the condition that occurs after complete fabrication of the FET. The value of the threshold voltage is analyzed to determine whether the wafer is suitable for further processing. One skilled in the art will appreciate that the invention provides a technique for characterizing the threshold voltage of actual transistors prior to device fabrication. There are a number of techniques that may be employed to determine the threshold voltage. A physical Schottky barrier may be formed on the etch stop layer by known techniques such as evaporating metal dots. Preferably, the electrolyte will be used to characterize the surface by formation of a Schottky barrier between the electrolyte and the wafer. The method employs an electrolyte as a Schottky barrier on a semiconductor to provide a means of obtaining the capacitance-voltage measurements of the depletion layer which is then analyzed to obtain the threshold voltage of the layer. Field penetration into the electrolyte is negligible and the semiconductor/electrolyte interface acts as a one-sided or Schottky junction, and conventional equations for the depletion width and capacitance for a metal/semiconductor junction may be employed, such as:

$$Wd = \sqrt{\frac{2\epsilon_0\epsilon_r[V_{fb} + V[SCE]]}{qN}}$$ Equation 1

$$C = A\sqrt{\frac{qN\epsilon_0\epsilon_r}{2[V_{fb} + V[SCE]]}}$$ Equation 2 where $V_{fb}$ is the flatband potential verses the SCE and is typically less than 0; V[SCE] is the applied voltage (V) verses the SCE; $\epsilon_0$ is the permittivity of free space; $\epsilon_r$ is the relative permittivity of the semiconductor; N is the carrier concentration and A is the effective etch area. Accordingly, the present invention provides a method to measure the threshold voltage (Vth), which is closely related to the so called pinch off voltage, of the Schottky diode placed on a very thin etch stop layer which is buried under another layer of possibly indeterminate thickness and high doping.

According to the method of the present invention, to obtain the value of the threshold voltage, it is necessary to determine the relationship between the potential in the solution and the band bending (i.e. the surface potential of the GaAs); that is, a reference for the voltage scale must be established. Conventional methods of measuring this potential provided with the profiling apparatus have proved unsatisfactory. For example, one parameter used with the profiling apparatus, the resting potential (which is the potential were no current flows into or out of the GaAs device), is influenced by defects at the semiconductor surface. The zero current condition occurs when electron injection into the semiconductor from the solution is balanced by hole injection. Electron injection is relatively simple, but hole injection can be very complicated and tends to take place through defects in the surface, rather than through the energy bands. Thus, the resting potential can vary for reasons that have nothing to do with the band bending at the surface. Another approach utilizing the illuminated resting potential is more reliable. If the illumination is constant, the holes that are generated by the illumination overwhelm any relatively small number of holes that would be related to surface defects so that the band positions that result are set by the balance of these photogenerated holes and electrons recombining at the surface. Thus, it is still dependent on surface properties but to a lesser extent than the resting potential. However, this technique depends on the amount of illumination, so when this method is used, the amount of illumination striking the wafer must be known by other means, and an empirical calibration is required in order to establish the relationship between the rest voltage and the semiconductor band bending.

Preferably, to determine Vth from the C-V measurements, a correlation between the energy band bending in the semiconductor and the voltage measured relative to the SCE reference electrode must be established. In order to measure the band bending of the GaAs, we may estimate the electrochemical potential at which the band bending would go to zero. This is typically referred to as the flat band potential, and this serves as a zero reference for the voltage scale. As will be apparent to one of skill in the art, the potential can vary from one batch of the solution to another, since the value depends upon the states of ions in solution and thus can vary due to trace impurities and changes in the ion concentration. This variation associated with the electrolyte batch can be removed by measurement of the flatband potential since it is an independent measurement that establishes the relationship between the surface conduction band energy and the electrochemical energy reference (i.e. the voltage of the saturated calomel electrode "VSCE"). The flatband potential is the reference used to give an absolute value to the threshold voltage, thus it is preferred that the flatband voltage be determined with each new electrolyte batch. In other words, the flatband potential measurement establishes the position of the surface Fermi level on the SCE scale for a given electrolyte batch.

Figure 6:
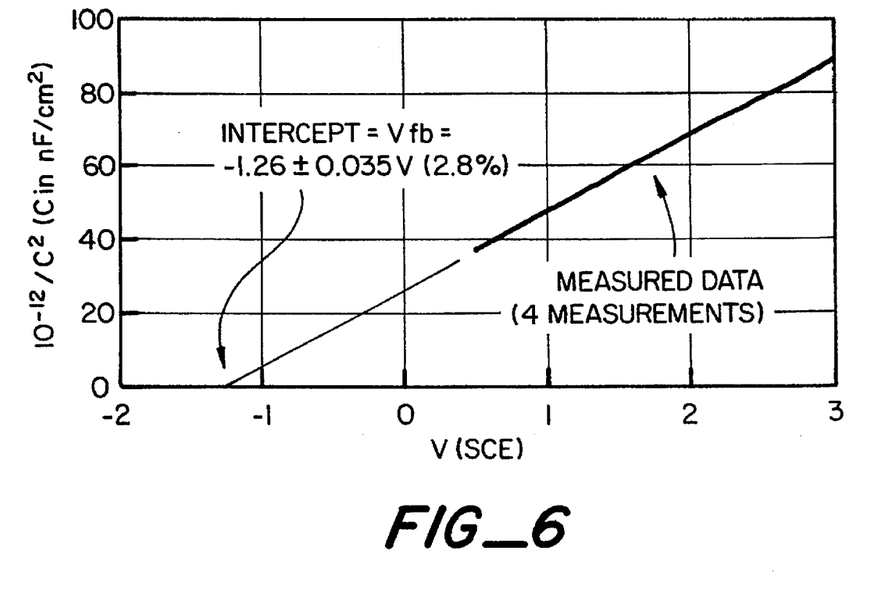
FIG. 6 is a graphical representation of the flatband potential according to the method of the present invention.

Preferably, the flatband voltage is obtained by measuring capacitance verses voltage for a nominally uniformly-doped layer, typically with n-type doping between 1 and $5\times10^{17}$/cm$^3$, and then plotting the inverse square of the capacitance verses the voltage. Extrapolation of the inverse square data to zero gives the flatband voltage $V_{fb}$ verses SCE as shown in FIG. 6 (Mott-Schottky plot). The relationship between the pinchoff (or threshold) voltage of a given layer as measured electrochemically using the same solution, and that obtained by forming a metal-semiconductor contact at the same location (i.e. the Schottky barrier) is then given by:

$$V_p[est] = V_p[SCE] - V_{fb} - \emptyset_{bi}$$ Equation 3 where $V_p[est]$ is the estimate of the pinchoff voltage measured by a Schottky barrier as in a FET structure, $V_p[SCE]$ is the pinchoff voltage measured electrochemically with respect to the saturated calomel electrode, $V_{fb}$ is the measured flatband potential verses the SCE (typically <0 in this case), and $\emptyset_{bi}$ is the built in potential of the FET Schottky barrier (typically is 0.8 volts).

It is important to note, that in other electrochemical measurements, this reference voltage is not as important as with the method of the present invention because it is not necessary to determine an absolute value. For example if the level of doping is sought, the reference scale for the voltage is not required, because the inquiry is directed to how far the band is perturbed, and not what the shape of the band is. In contrast, the inventive method measures the Vth relative to a piece of metal that will be fabricated on the structure during processing. Thus, it is desirable to ascertain exactly what the voltage was that produced this band bending.

EXAMPLE 1

In Example 1 a device structure employing an $Al_{0.35}Ga_{0.65}As$ etch stop layer over a pseudomorphic HEMT (PHEMT) device was characterized. The device structure was prepared as shown generally in FIG. 1, and pursuant to the Table 2 below:

TABLE 2

| layer | mole % Al | thickness (Å) | dopant |
| --- | --- | --- | --- |
| GaAs cap | 0 | 500 | none |
| AlAs etch stop | 35 | 25 | none |
| AlGaAs | 25 | 220 | none |
| doping plane | 0 | — | Si to spec |
| AlGaAs spacer | 25 | 30 | none |
| InGaAs well | 15% In | 150 | none |
| GaAs buffer |  | 5000 | none |

The method was performed in the apparatus of FIG. 3, after cleaning the sample in a mixture of 10 parts deionized water to 1 part 30% $NH_4OH$ for 10 seconds followed by a deionized water rinse.

Figure 7:
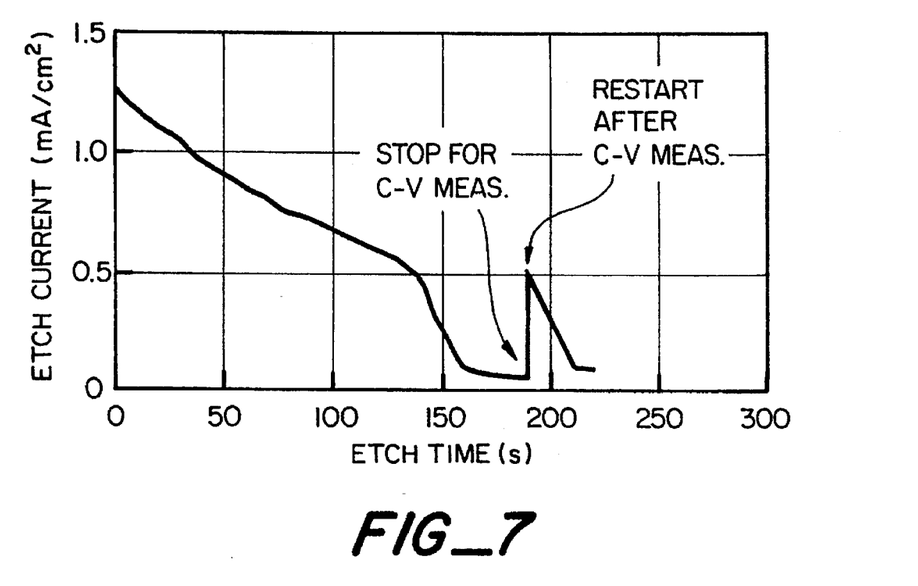
FIG. 7 illustrates the etch current as a function of time of the present invention practiced pursuant to the parameters in Example 1.

A mixture of 1M citric acid and 1M potassium citrate was added to the cell for anodization. The absolute level of illumination was not determined, but could be replicated by reproducing the current density reported in FIG. 7 below. The semiconductor was held at 0 VSCE during the anodization. The anodization current versus time is depicted in FIG. 7. A small crater was etched on the surface of the wafer corresponding to the area illuminated. Anodization and dissolution proceed readily on the GaAs layer, but etching stops abruptly on the AlGaAs layer, as shown by the sudden decrease in current in FIG. 7. Anodization continued until a current of 0.06 mA/cm² was reached. At this point the anodization was terminated and a capacitance-voltage (C-V) curve measured, from which the pinchoff voltage of the active layer below the etch stop region can be obtained as illustrated in FIG. 5, and translated to an equivalent Schottky barrier measurement with the aid of the flatband potential measurement illustrated in FIG. 6. The pinchoff voltage obtained was 1.05 VSCE. The flatband potential of this solution was found separately to be −1.23 VSCE using the technique described above. Using Equation 3 above we may obtain the pinchoff voltage measured on the same layer using a Schottky barrier with built-in potential of 0.8 volts as:

$$1.05-(-1.23)-0.8=1.48 \text{ volts}=V_p[\text{est}]$$

Note that when anodization was re-initiated after the capacitance-voltage measurement, a large transient increase in anodization current was observed. This indicates that the passivating oxide was partly removed during the C-V measurement, and was reformed subsequently with some erosion of the underlying layers. As noted above, the use of lower Al concentrations in the etch stop layer renders the method less robust. While valid data may be obtained with the above 25 Å layer of $Al_{0.35}Ga_{0.65}As$, the use of a higher concentration of aluminum (and consequently a thinner layer) for stopping the etch is considered to be more reliable and is a preferred choice.

EXAMPLE 2

In another example, a second material type was characterized according to the present invention. The structure of the device tested is generally described in Table 3 below:

TABLE 3

| layer | mole % Al | thickness (Å) | dopant |
| --- | --- | --- | --- |
| GaAs cap | 0 | 1000 | 2.5E18 |
| GaAs cladding | 0 | 6 | none |
| AlAs etch stop | 100 | 12 | none |
| GaAs cladding | 0 | 6 | none |
| GaAs low-doped layer | 0 | 460 | 4.5E17 |
| GaAs high-doped layer | 0 | 205 | 7E17 |
| GaAs buffer | 0 | 5000 | none |

Note that in this case there are layers underneath the etch stop layer (i.e. 6 angstrom GaAs cladding layer and the MESFET active layers 14 of GaAs low doped layer and GaAs high doped layer) which contain no aluminum, so that if the etch stop layer were to be penetrated during the characterization one would anticipate extensive erosion of the underlying GaAs. Thus, such material and structure constitute a stringent test of the selectivity of the inventive method.

Figure 8:
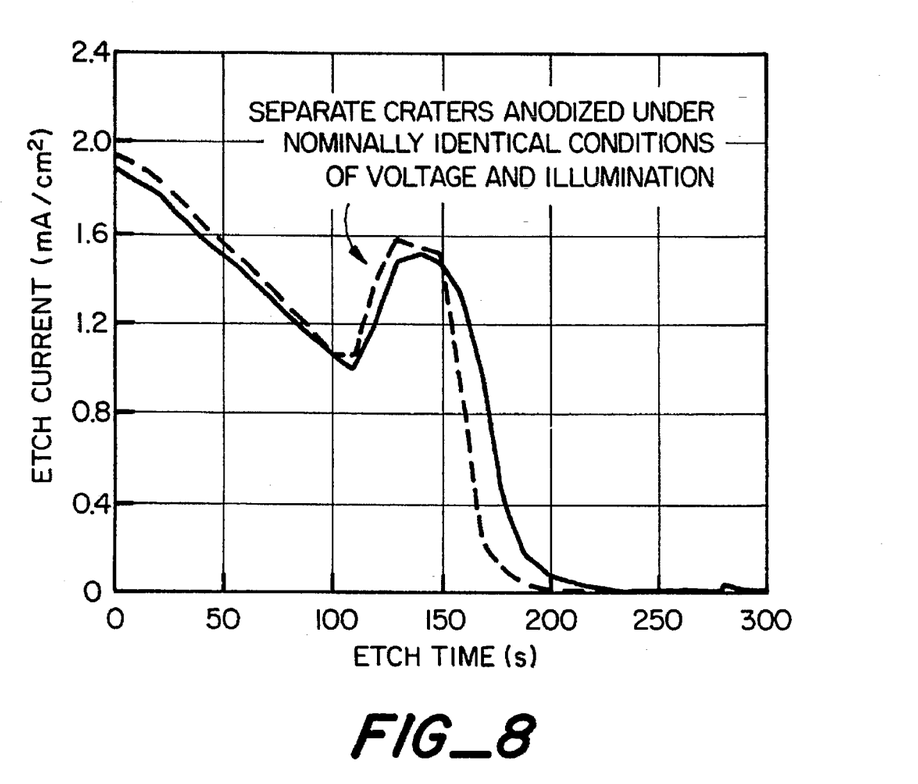
FIG. 8 depicts etch current as a function of time obtained pursuant to the parameters in Example 2.

The method was performed as set forth in Example 1 above, however a number of tests were performed using varying illumination settings from 62 to 70 (corresponding to initial anodization currents from 1.3 to 2.5 mA/cm²), and varying anodization voltages from −0.2 to 0.2 VSCE. In all cases the etch stopped robustly on the stop layer and reproducible C-V measurements were obtained. Two crater were etched, and an exemplary representation of the current-verses-time characteristics for the two craters with nominally identical etching parameters, is shown in FIG. 8. A maximum in the current is noted prior to the sharp reduction indicating the etch stop layer. This behavior is typical of this material type (GaAs only except for the stop layer), and is believed to arise from the decrease in non-radiative recombination of the holes created by illumination when the surface depletion layer extends to the AlAs etch stop.

Despite the underlying GaAs layer, and the absence of a layer containing Al beneath the stop layer in this Example 2, the inventive method is found to stop reliably and robustly as shown in FIG. 8, with no evidence of a sudden increase in anodization current even well after the etch stop layer is encountered, as seen in FIG. 8. Because of the robustness of the AlAs layer, repeated C-V measurements are possible with similar results. In this case two consecutive C-V measurements were obtained after the etch current "stopped" (which is indicated by a decrease in etch current to less than 0.02 mA/cm² ), and a third C-V measurement was taken after an additional 30 seconds of anodization. The pinchoff voltages obtained were 1.15, 1.10 and 1.13 VSCE, respectively, and these voltages may be similarly converted to Schottky barrier measurements and the pinchoff voltage value by using Equation 3 and the procedure described in Example 1. Thus, there is no evidence of erosion of the underlying GaAs layer, and reliable measurements may be easily obtained.

Figure 9:
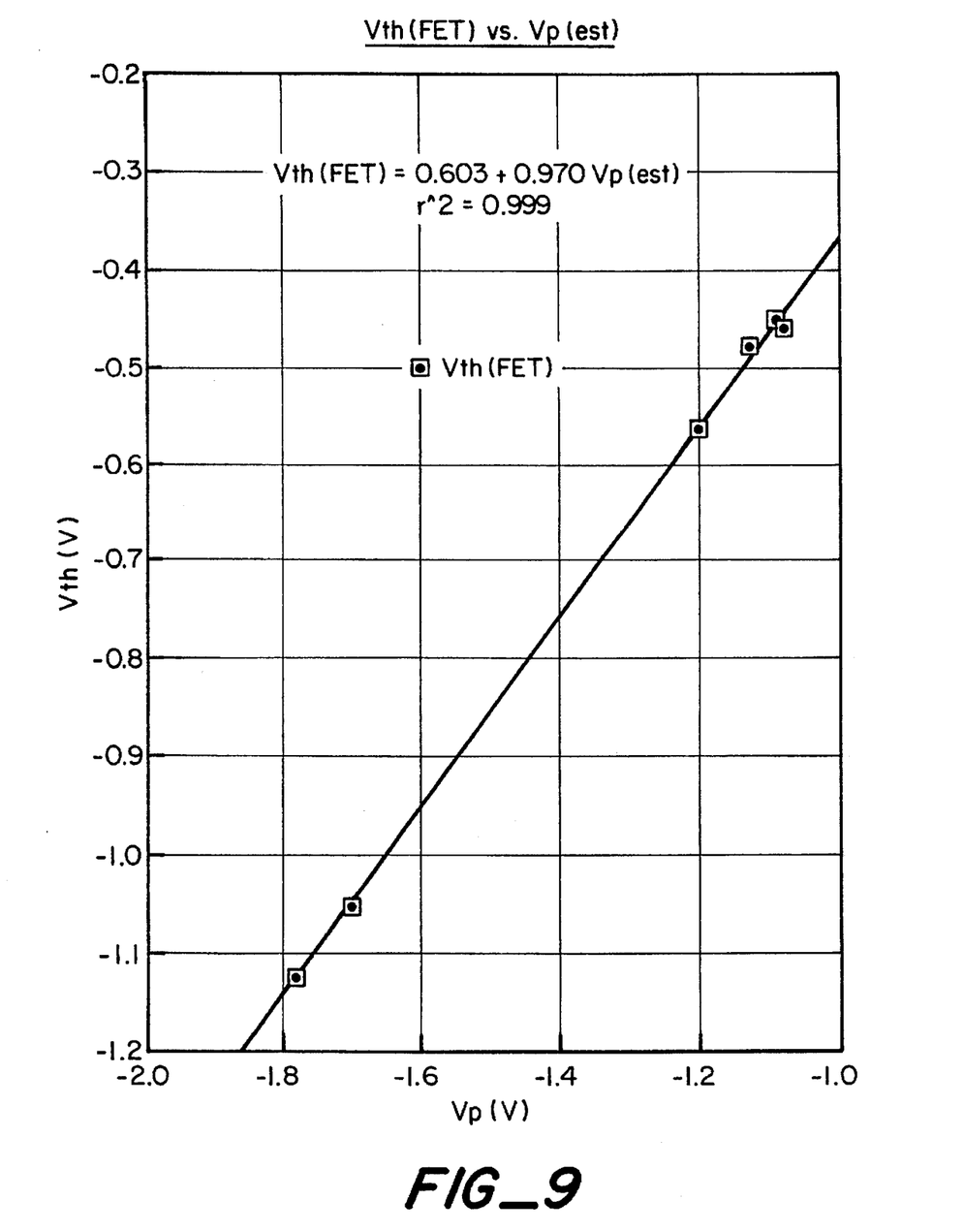
FIG. 9 represents the correlation between the estimated pinchoff voltages obtained according to the present inventive method and the threshold voltage obtained from actual FET devices later fabricated on the same wafers.

The accuracy of the Vth measurements were tested by comparison to Vth data obtained using a typical metal Schottky barrier (i.e. a FET gate), and is shown in FIG. 9.

Craters were etched on samples and the Vth data was obtained by C-V measurement according to the method of the present invention. Comparison data was obtained by fabricating FETs on the same wafers using the method described in U.S. Pat. No. 5,374,328 and then obtaining the threshold voltage of such FETs by conventional techniques. As illustrated in FIG. 9, excellent correlation is obtained between the threshold voltage measured according to the present invention (represented by Vp(V) on FIG. 9) and the threshold voltage of the fabricated transistors (represented by the Vth(V) on the FIG.).

The foregoing description of specific embodiments of the invention have been presented for the purpose of illustration and description. They are not intended to be exhaustive or to limit the invention to the precise forms disclosed, and obviously many modifications, embodiments, and variations are possible in light of the above teaching. It is intended that the scope of the invention be defined by the Claims appended hereto and their equivalents.

I claim:

1. A method of determining the threshold voltage of a semiconductor wafer placed in a characterization profiling apparatus having an electrolytic cell, said wafer having a first active layer and a thin etch stop layer atop said first active layer, and at least one second layer atop of said etch stop layer, characterized in that the threshold voltage at the location of said first active layer is determined by etching the second layer by exposing the second layer to a solution of citric acid and a salt of citric acid, illuminating the surface, and applying an anodic bias to said wafer, wherein etching terminates selectively upon reaching said etch stop layer, and then performing a capacitance-voltage measurement to determine the threshold voltage.

2. A method of characterizing a Group III-V epitaxial semiconductor wafer positioned in a characterization profiling apparatus having an electrolytic cell, said semiconductor wafer having a first layer, an etch stop layer atop of said first layer, and at least one second layer atop of said etch stop layer having a differing composition from said etch stop layer, comprising the steps of:

providing a solution of citric acid and a salt of citric acid in said electrolytic cell such that said solution contacts the surface of said at-least one second layer;

applying an anodic bias to said semiconductor wafer;

illuminating said semiconductor wafer to cause an oxide to form on the surface of said at-least second layer wherein the solution, illumination and anodic bias cause etching of the second layer;

etching said second layer to the etch stop layer wherein the etching selectively terminates; and characterizing said wafer by performing capacitance-voltage measurements to determine the threshold voltage of said wafer.

3. The method of Claim 2 wherein the step of characterizing the device further results in determining the dopant concentration of said device.

4. The method of claim 2 wherein said thin etch stop layer is comprised of $Al_xGa_{x-1}As$.

5. The method of claim 2 wherein said thin etch stop layer is comprised of AlAs.

6. The method of claim 4 wherein the mole fraction x of Al in said $Al_xGa_{x-1}As$ is in the range of approximately 0.35 to 1.0.

7. The method of claim 4 wherein the mole fraction x of Al in said $Al_xGa_{x-1}As$ is approximately 0.35.

8. The method of claim 2 further including the step of formulating said solution such that the concentration of said solution of citric acid and a salt of citric acid is substantially in the range of 0.6 to 1.0 moles/liter.

9. The method of claim 2 wherein said salt of citric acid comprises potassium citrate.

10. A method of characterizing a Group III-V epitaxial semiconductor wafer positioned in a profiling apparatus having an electrolytic cell, said semiconductor wafer having a first layer and, an etch stop layer atop of said first layer, and at least one second layer atop of said etch stop layer, comprising the steps of:

fabricating said wafer having said at least one second layer comprised of a Group III-V compound, and a thin etch stop layer comprised of $Al_xGa_{x-1}As$ and where the Al content x is approximately in the range of 0<x<1;

providing a solution of citric acid and a salt of citric acid in said electrolytic cell such that said solution contacts the surface of said at-least one second layer and the solution is formulated in a concentration range of substantially 0.6 to 1.0 moles/liter;

applying an anodic bias to said semiconductor wafer;

illuminating the surface of said semiconductor wafer to cause an oxide to form on the surface of said at-least one second layer;

etching said at-least one second layer whereby the solution of citric acid and a salt of citric acid selectively etch said at-least one second layer;

terminating etching at the etch stop layer; and characterizing said wafer while it is still placed within the apparatus by performing capacitance-voltage measurements and determining the threshold voltage of said wafer.

11. The method of claim 10 wherein said salt of citric acid comprises potassium citrate.

12. The method of claim 10 wherein the mole fraction x of Al in said $Al_xGa_{x-1}As$ is approximately 0.35.

13. A method of etching a Group III-V epitaxial semiconductor wafer positioned in an apparatus having an electrolytic cell, said semiconductor wafer having an etch stop layer and at least one layer atop of said etch stop layer, comprising the steps of:

fabricating said wafer having said at least one layer comprised of a Group III-V compound, and a thin etch stop layer comprised of $Al_xGa_{x-1}As$ and where the Al content x is approximately in the range of 0.35 to 1;

providing a solution of citric acid and a salt of citric acid in said electrolytic cell such that said solution contacts the surface of said at-least one layer and said solution is formulated in a concentration range of substantially 0.6 to 1.0 moles/liter;

applying an anodic bias to said semiconductor wafer;

illuminating the surface of said semiconductor wafer to cause an oxide to form on the surface of said at-least one layer;

etching said at-least one layer whereby said solution of citric acid and a salt of citric acid selectively etch said at-least one layer; and terminating etching at the etch stop layer.

14. The method of claim 13 wherein said thin etch stop layer is comprised of AlAs.

15. The method of claim 13 wherein said salt of citric acid comprises potassium citrate.

16. The method of claim 13 further comprising the step of forming a Schottky diode between the wafer and the solution and performing capacitance-voltage measurements and determining the threshold voltage of the wafer.

* * * * *